United States Patent
Ionita et al.

(10) Patent No.: US 9,467,164 B2
(45) Date of Patent: Oct. 11, 2016

(54) APPARATUS AND METHOD FOR SUPPORTING POLAR CODE DESIGNS

(71) Applicant: Texas Instruments Incorporated, Dallas, TX (US)

(72) Inventors: Corina Ioana Ionita, Katy, TX (US); June Chul Roh, Allen, TX (US); Mohamed F. Mansour, Richardson, TX (US); Srinath Hosur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 62 days.

(21) Appl. No.: 14/503,513

(22) Filed: Oct. 1, 2014

(65) Prior Publication Data
US 2015/0092886 A1 Apr. 2, 2015

Related U.S. Application Data

(60) Provisional application No. 61/885,351, filed on Oct. 1, 2013.

(51) Int. Cl.
| | |
|---|---|
| *H04L 27/36* | (2006.01) |
| *H03M 5/18* | (2006.01) |
| *H04L 25/49* | (2006.01) |

(Continued)

(52) U.S. Cl.
CPC ............ *H03M 5/18* (2013.01); *H03M 13/251* (2013.01); *H04L 25/4917* (2013.01); *H04L 27/364* (2013.01); *H03M 13/13* (2013.01);
(Continued)

(58) Field of Classification Search
CPC ..... H03M 5/18; H03M 13/612; H04L 27/34; H04L 27/362
USPC ....... 375/298, 262, 268; 714/6.23, 755, 776; 341/57
See application file for complete search history.

(56) References Cited

U.S. PATENT DOCUMENTS

| | | |
|---|---|---|
| 5,150,381 A | 9/1992 | Forney, Jr. et al. |
| 5,195,107 A | 3/1993 | Wei |

(Continued)

OTHER PUBLICATIONS

Mansour, et al.; U.S. Appl. No. 14/502,011; "Apparatus and Method for Multilevel Coding in Communication Systems", filed Sep. 30, 2014; 43 pages.

(Continued)

*Primary Examiner* — Khai Tran
(74) *Attorney, Agent, or Firm* — Ronald O. Neerings; Frank D. Cimino

(57) ABSTRACT

A method includes simulating transmission of multiple symbols representing multiple bits over at least one communication channel, where the multiple symbols are associated with a polar code. The method also includes identifying error rates of equivalent bit channels associated with the simulated transmission of the symbols. The method further includes selecting a specified number of the bits as frozen bits in the polar code using the identified error rates. Simulating the transmission of the symbols could include computing log likelihood ratio (LLR) values associated with the equivalent bit channels and simulating polar decoding of received symbols using the LLR values. Identifying the error rates could include calculating means and variances of the LLR values associated with the equivalent bit channels and identifying probability density functions of the LLR values using the means and variances. The selected bits could represent the specified number of bits identified as having worst error rates.

20 Claims, 7 Drawing Sheets

(51) Int. Cl.
H03M 13/15 (2006.01)
H03M 13/25 (2006.01)
H03M 13/13 (2006.01)

(52) U.S. Cl.
CPC ........ *H03M 13/152* (2013.01); *H03M 13/255* (2013.01); *H04L 27/36* (2013.01)

(56) References Cited

U.S. PATENT DOCUMENTS

| | | | |
|---|---|---|---|
| 5,214,672 A | 5/1993 | Eyuboglu et al. | |
| 8,347,186 B1 | 1/2013 | Arikan | |
| 8,787,477 B2 | 7/2014 | Mansour et al. | |
| 2014/0108748 A1* | 4/2014 | Lee | H03M 13/1111 711/154 |
| 2014/0177740 A1 | 6/2014 | Mansour et al. | |
| 2015/0026543 A1* | 1/2015 | Li | H03M 13/13 714/776 |
| 2015/0077277 A1* | 3/2015 | Alhussien | H03M 13/2906 341/67 |

OTHER PUBLICATIONS

Ionita, et al.; U.S. Appl. No. 14/503,547; "Apparatus and Method for Multilevel Coding (MLC) with Binary Alphabet Polar Codes", filed Oct. 1, 2014; 51 pages.

Miller, et al.; "End-to-End Communication Test on Variable Length Packet Structures Utilizing AOS Testbed"; Third International Symposium on Space Mission Operations and Ground Data Systems; Nov. 1994; 9 pages.

Prodan, et al.; "Forward Error Correction Proposal for EPOC Phy Layer"; printed from http://www.ieee802.org/3/bn/public/sept12/prodan_01b_0912.pdf; Broadcom; IEEE 802.3bn EPoC; Sep. 2012; 13 pages.

Arikan, E.; "Channel Polarization: A Method for Constructing Capacity—Achieving Codes for Symmetric Binary-Input Memoryless Channels"; IEEE Transactions on Information Theory; vol. 55; Jul. 2009; 23 pages.

Arikan, et al.; "On the Rate of Channel Polarization"; IEEE International Symposium on Information Theory; No. 2; Jun. 2009; 5 pages.

Hassani, et al.; "Rate-Dependent Analysis of the Asymptotic Behavior of Channel Polarization"; IEEE Transactions on Information Theory; vol. 59; Apr. 2013; 10 pages.

Sasoglu, et al.; "Polarization for Arbitrary Discrete Memoryless Channels"; IEEE Information Theory Workshop; vol. 2; 2009; 5 pages.

Leroux, et al.; "A Semi-Parallel Successive-Cancellation Decoder for Polar Codes"; IEEE Transactions on Signal Processing; vol. 61; Jan. 2013; 11 pages.

Wachsmann, et al.; "Multilevel Codes: Theoretical Concepts and Practical Design Rules"; IEEE Transactions on Information Theory; vol. 45; Jul. 1999; 31 pages.

Shin, et al.; "Mapping Selection and Code Construction for 2m-ary Polar-Coded Modulation"; IEEE Communications Letters; vol. 16; Jun. 2012; 4 pages.

Seidl, et al.; "Polar-Coded Modulation"; printed from http://arxiv.org/abs/1302.2855v1; Feb. 2013; 11 pages.

Mori, et al.; "Performance of Polar Codes with the Construction Using Density Evolution"; IEEE Communications Letters; vol. 13; Jul. 2009; 3 pages.

Korada, et al.; "Polar Codes: Characterization of Exponent, Bounds, and Constructions"; IEEE Transactions on Information Theory; vol. 56; Dec. 2010; 12 pages.

Tal, et al.; "How to Construct Polar Codes"; printed from http://arxiv.org/abs/1105.6164; May 2011; 21 pages.

Mori, et al.; "Performance and Construction of Polar Codes on Symmetric Binary-Input Memoryless Channels" ; IEEE International Symposium on Information Theory; IEEE; Jun. 2009; 5 pages.

Tal, et al.; "List Decoding of Polar Codes"; Information Theory Proceedings (ISIT); IEEE International Sumposium; 2011; 11 pages.

Kumar, et al. "A GPU Implementation of Belief Propagation Decoder for Polar Codes"; Signals, Systems and Computers (ASILOMAR); Conference Record of the Forty Sixth Asilomar Conference; 2012; 5 pages.

Goldsmith, et al. "Adaptive Coded Modulation for Fading Channels"; IEEE Transactions on Communications; vol. 46; May 1998; 8 pages.

"3rd Generation Partnership Project; Technical Specification Group Radio Access Network; Evolved Universal Terrestrial Radio Access (E-UTRA); Multiplexing and Channel Coding"; 3GPP TS 36.212; Release 9.2.0; Jun. 2010; 61 pages.

Sasoglu, E.; "An Entropy Inequality for q-ary Random Variables and its Application to Channel Polarization"; IEEE Iinternational Symposium on Information Theory; IEEE; Jun. 2010; 4 pages.

Sasoglu, E.; "Polar Codes for Discrete Alphabets"; IEEE Iinternational Symposium on Information Theory Proceedings; vol. 1; Jul. 2012; 5 pages.

* cited by examiner

APPARATUS AND METHOD FOR SUPPORTING POLAR CODE DESIGNS

CROSS-REFERENCE TO RELATED APPLICATION AND PRIORITY CLAIM

This application claims priority under 35 U.S.C. §119(e) to U.S. Provisional Patent Application No. 61/885,351 filed on Oct. 1, 2013. This provisional patent application is hereby incorporated by reference in its entirety.

TECHNICAL FIELD

This disclosure is generally directed to communication systems. More specifically, this disclosure is directed to an apparatus and method for supporting polar code designs.

BACKGROUND

Many modern wireless and other communication systems encode digital data for transmission over communication paths. One type of coding mechanism involves the use of polar codes, which are used to encode data words into encoded data words that are then mapped into symbols for transmission. Polar codes can be used to achieve capacity of binary-input memoryless symmetric channels, meaning the polar codes allow the full capacity of a channel to be utilized. Polar codes allow this to be achieved using low-complexity encoding and decoding algorithms.

Recently, various attempts have been made to use communication channels more efficiently based on higher-order modulation techniques, such as multilevel quadrature amplitude modulation (M-QAM). However, extending the use of polar codes to systems that use higher-order modulation techniques is not a simple task. For example, output bits from a binary polar code often experience different effective channels because of their mapping to higher-order symbols. As a result, standard techniques for polar code design are not generally applicable to systems using higher-order modulation techniques.

SUMMARY

This disclosure provides an apparatus and method for supporting polar code designs.

In a first embodiment, a method includes simulating transmission of multiple symbols representing multiple bits over at least one communication channel, where the multiple symbols are associated with a polar code. The method also includes identifying error rates of equivalent bit channels associated with the simulated transmission of the symbols. The method further includes selecting a specified number of the bits as frozen bits in the polar code using the identified error rates.

In a second embodiment, an apparatus includes at least one memory configured to store instructions. The apparatus also includes at least one processing device configured to execute the instructions in order to simulate transmission of multiple symbols representing multiple bits over at least one communication channel, where the multiple symbols are associated with a polar code. The at least one processing device is also configured to execute the instructions in order to identify error rates of equivalent bit channels associated with the simulated transmission of the symbols. The at least one processing device is further configured to execute the instructions in order to select a specified number of the bits as frozen bits in the polar code using the identified error rates.

In a third embodiment, a non-transitory computer readable medium embodies a computer program. The computer program includes computer readable program code for simulating transmission of multiple symbols representing multiple bits over at least one communication channel, where the multiple symbols are associated with a polar code. The computer program also includes computer readable program code for identifying error rates of equivalent bit channels associated with the simulated transmission of the symbols. The computer program further includes computer readable program code for selecting a specified number of the bits as frozen bits in the polar code using the identified error rates.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1A:
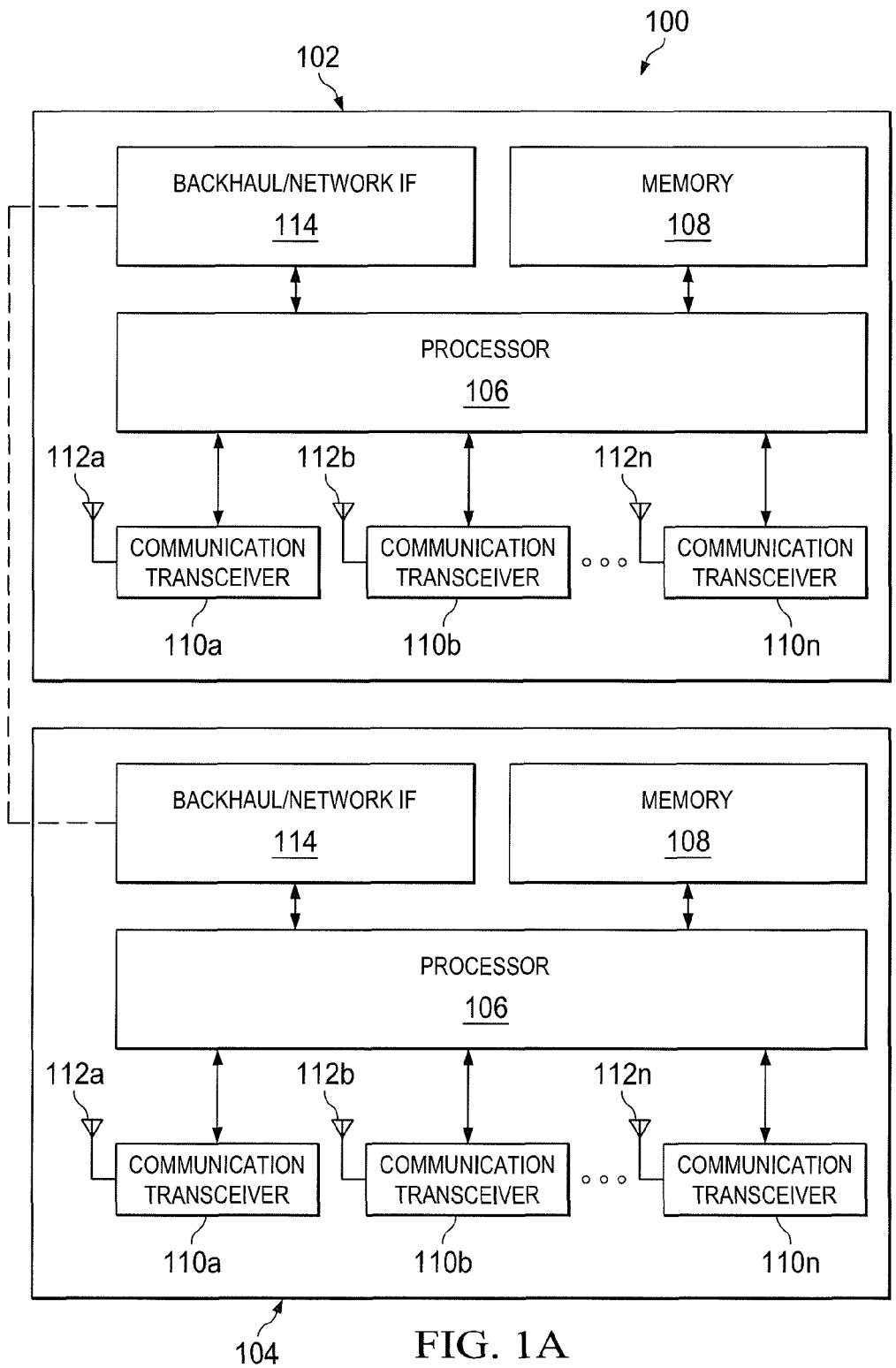
FIGS. 1A and 1B illustrate example systems that use polar codes in accordance with this disclosure.
Figure 1B:
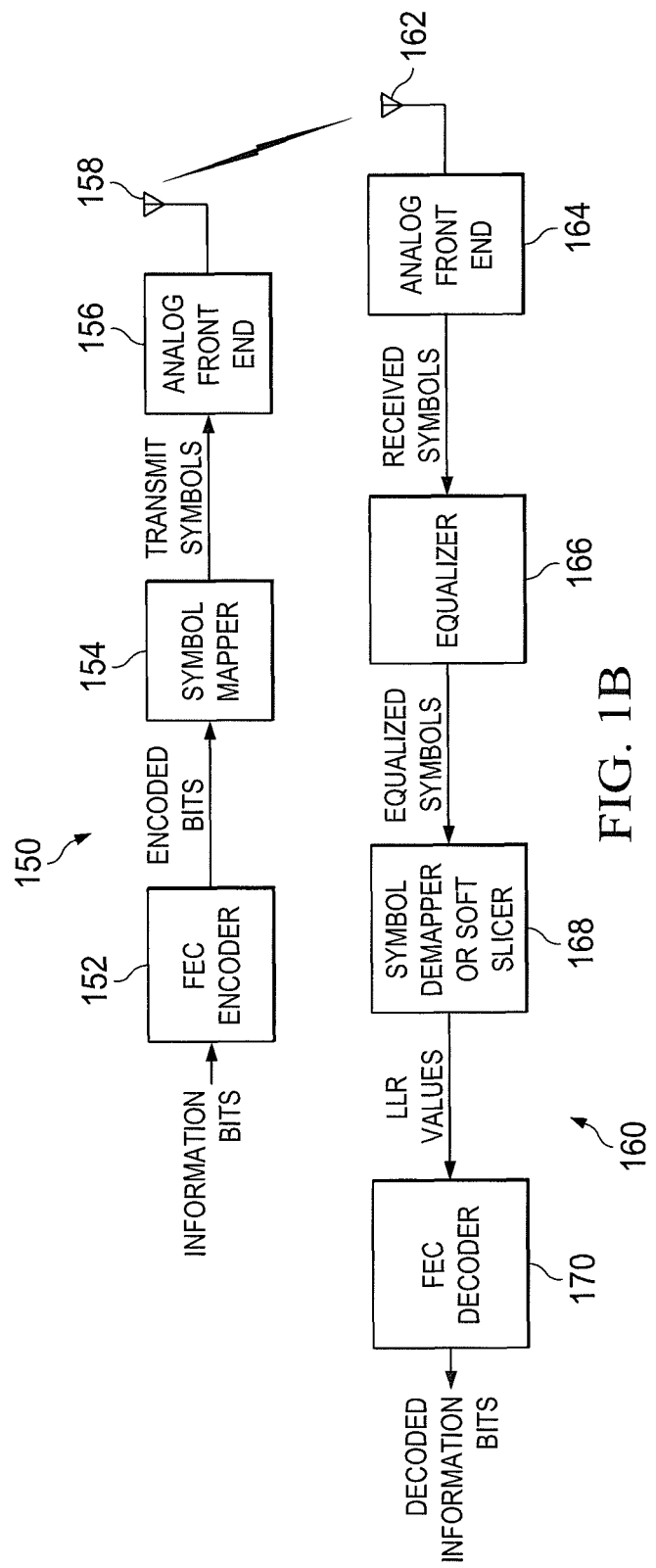

FIGS. 1A and 1B illustrate example systems that use polar codes in accordance with this disclosure. As shown in FIG. 1A, communications in a system 100 occur between two base stations 102-104. However, this is for illustration only, and the techniques described in this patent document could be used to support wireless or other communications using polar codes between any suitable devices or systems.

Each base station 102-104 shown in FIG. 1A generally denotes an infrastructure component that provides wireless service to one or more wireless devices. Other types of infrastructure components that are encompassed by the phrase "base station" include enhanced Node Bs (eNBs) and access points. Similarly, a base station can communicate with any number of wireless devices, each of which generally denotes a device that receives wireless service from at least one infrastructure component. Other types of devices that are encompassed by the phrase "wireless device" include mobile stations, user equipment, wireless terminals, or other fixed or mobile devices. The base stations 102-104 could communicate using any suitable protocol(s) supporting the use of polar codes.

As shown in FIG. 1A, each base station 102-104 includes at least one processing device 106 and at least one memory 108. The at least one processing device 106 executes logic in order to control the overall operation of the base station 102-104 and to support communications with wireless devices. The exact operations of the processing device(s) 106 can vary depending on, for example, the protocol(s) supported by the base stations 102-104. Each processing device 106 includes any suitable processing or control device, such as a microprocessor, microcontroller, digital signal processor (DSP), field programmable gate array (FPGA), application specific integrated circuit (ASIC), or discrete logic devices. The at least one memory 108 stores instructions and data used, generated, or collected by the base station 102-104. Each memory 108 includes any suitable volatile or non-volatile storage and retrieval device, such as a random access memory (RAM) or a Flash or other read-only memory (ROM).

Each base station 102-104 also includes multiple communication transceivers 110a-110n, each of which (if implemented to support wireless communications) may be coupled to at least one of multiple antennas 112a-112n. Each communication transceiver 110a-110n supports communications with other devices, such as portable or other wireless devices. Each communication transceiver 110a-110n includes any suitable structure supporting communications over one or more wired or wireless communication channels. For example, each communication transceiver 110a-110n can include transmit circuitry that facilitates the transmission of signals from the communication transceiver and receive circuitry that facilitates the processing of signals received by the communication transceiver. Each antenna 112a-112n represents any suitable structure for transmitting and receiving communication signals, such as a radio frequency (RF) antenna. Note that while each communication transceiver 110a-110n is shown here as having its own antenna 112a-112n, multiple communication transceivers could share one or more common antennas, or each communication transceiver could have multiple antennas.

A backhaul interface 114 supports communications between the base stations 102-104 themselves or between a base station 102-104 and other component(s) via a backhaul network. For example, the backhaul interface 114 could allow the base stations 102-104 to communicate with one another. The backhaul interface 114 includes any suitable structure for facilitating communications over a backhaul network, such as a microwave communications unit or an optical fiber interface.

FIG. 1B illustrates an example system having a point-to-point transmitter 150 and receiver 160. The transmitter 150 and the receiver 160 could be used in the base stations 102-104 of FIG. 1A or in any other suitable devices. As shown in FIG. 1B, the transmitter 150 includes a forward error correction (FEC) encoder 152, a symbol mapper 154, an analog front end 156, and at least one antenna 158. The FEC encoder 152 receives information bits and generates encoded bits, such as by using a polar code. The symbol mapper 154 maps the encoded bits into transmit symbols, which the analog front end 156 transmits wirelessly via the antenna(s) 158.

The receiver 160 includes at least one antenna 162, an analog front end 164, an equalizer 166, a symbol demapper or soft slicer 168, and an FEC decoder 170. The analog front end 164 receives symbols transmitted from the transmitter 150 via the antenna(s) 162 and provides the received symbols to the equalizer 166. The equalizer 166 pre-processes the received symbols, and the equalized symbols are used to generate log-likelihood ratio (LLR) values by the symbol demapper or soft slicer 168. The LLR values are used by the EEC decoder 170 to generate decoded information bits. Ideally, the decoded information bits from the FEC decoder 170 match the information bits provided to the FEC encoder 152.

Communications from a transmitter to a receiver can occur using various modulation techniques, such as binary modulation or M-QAM. Specific examples of higher-order modulation techniques include 1024-QAM, 2048-QAM, 4096-QAM, and multilevel coding (MLC) techniques. Higher-order modulation techniques are often desirable because they allow systems to achieve very high levels of spectral efficiency. However, as noted above, standard techniques for polar code design are not generally applicable to systems using higher-order modulation techniques.

This disclosure provides techniques that support the design of polar codes, including polar codes that are used with higher-order modulation techniques. The design of a specific polar code is equivalent to determining a set of "frozen bits" in an input vector. A "frozen bit" denotes a bit whose value is fixed in both the input vector to a polar encoder and in an output vector from a polar decoder. The remaining bits in the input and output vectors are called "information bits" and can be used to transport data over a wireless or other channel.

As described in more detail below, a polar code is designed by performing simulations to collect various statistics of log-likelihood ratio (LLR) values of each equivalent bit channel (the channel between a bit input to a polar encoder and a bit output from a polar decoder). The statistics are used to estimate the probability of error for each equivalent bit channel assuming all other bits are decoded correctly. The error probabilities for the bit channels are used to select the frozen bits, such as by selecting a specified number of bits with the worst error probabilities as the frozen bits. The remaining bits can be used as information bits.

This approach supports the design of polar codes for a given modulation technique. Various benefits can be obtained using this approach, although the specific benefits depend on the particular implementation. For example, using this approach, it is possible to predict the best data rate that can be achieved with a given signal-to-noise ratio (SNR). Moreover, this approach can simplify the identification of the proper rates to be used for certain polar codes. Conventional techniques often rely on trials with random rates for specific SNRs in order to identify the optimized set of rates to be used, while this approach simplifies the process by providing an approximate operating point. In addition, this approach is applicable to both binary and higher-order modulation techniques (such as M-QAM). Additional details regarding this approach for designing polar codes are provided below.

Although FIGS. 1A and 1B illustrate examples of systems that use polar codes, various changes may be made to FIGS. 1A and 1B. For example, polar codes could be designed to operate in any other suitable system. Moreover, infrastructure components, networks, transmitters, and receivers come in a wide variety of designs and configurations, and FIGS. 1A and 1B do not limit the scope of this disclosure to any particular infrastructure component, network, transmitter, or receiver.

Figure 2:
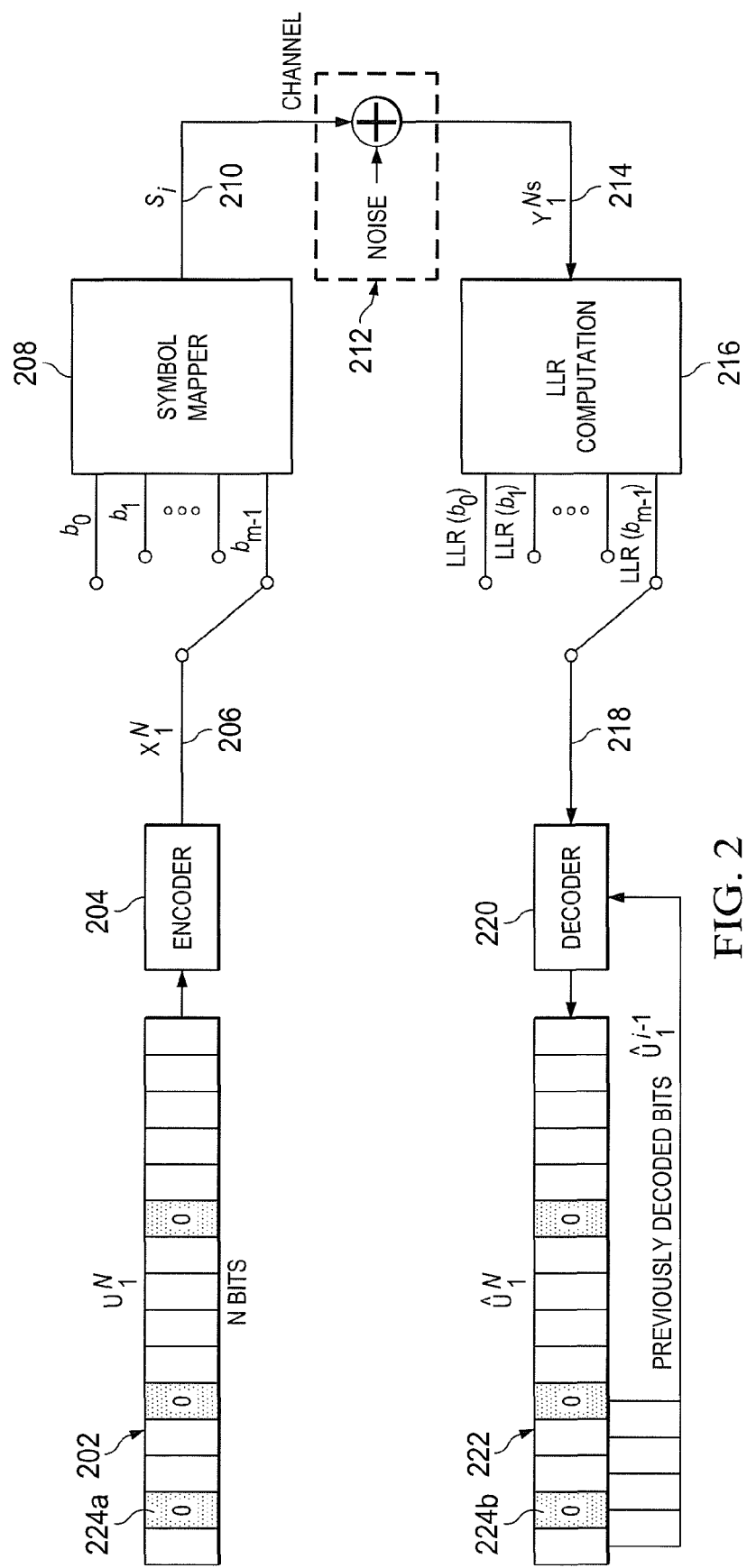
FIGS. 2 through 4 illustrate example encoding and decoding schemes using polar codes in accordance with this disclosure.
Figure 3:
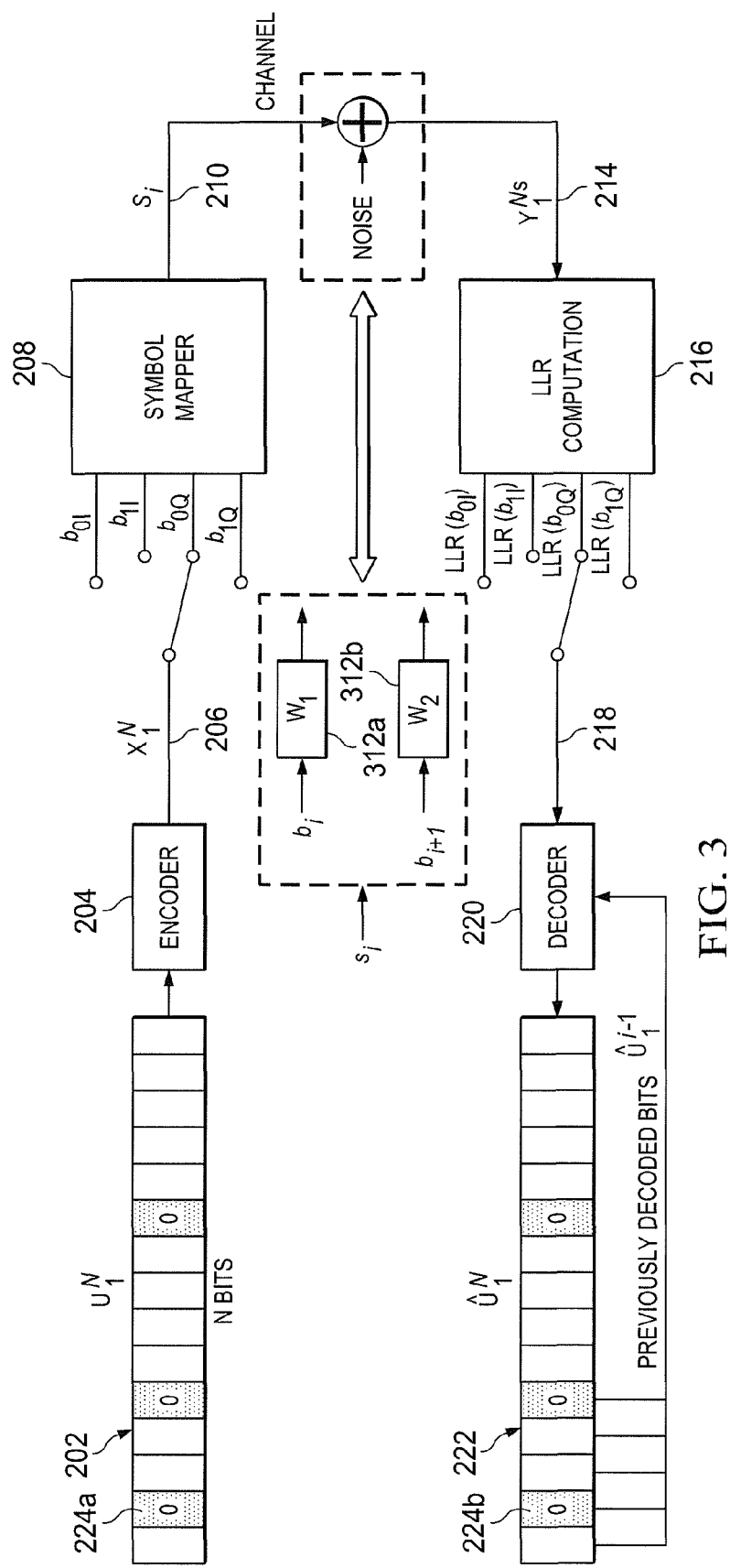
Figure 4:
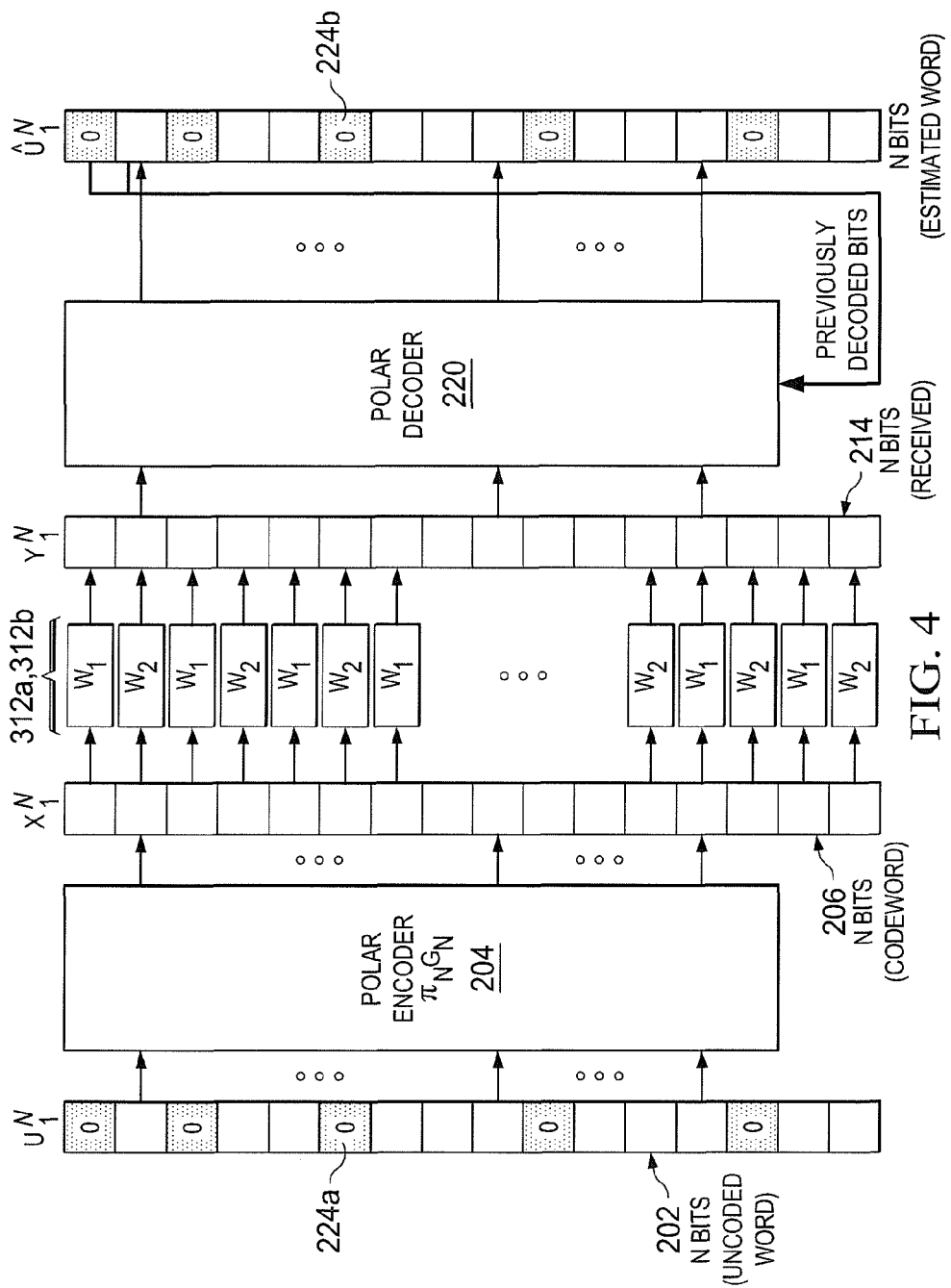

FIGS. 2 through 4 illustrate example encoding and decoding schemes using polar codes in accordance with this disclosure. The encoding and decoding schemes could, for example, be used by the base stations 102-104 or by the transmitter 150 and receiver 160 to communicate over one or more wireless or other communication channels. However, the encoding and decoding schemes could be used with any other suitable devices and in any other suitable systems.

As shown in FIG. 2, input vectors $u_1^N$ 202 (each containing N bits) are provided to a polar encoder 204. The polar encoder 204 uses the input vectors 202 and a polar code to generate codewords $x_1^N$ 206, which represent encoded vectors (each containing N bits). The codewords 206 are provided to a symbol mapper 208, which generates a series of transmit symbols $S_i$ 210. The polar encoder 204 includes any suitable structure for generating codewords using a polar code. The symbol mapper 208 includes any suitable structure for mapping codewords to symbols.

The symbols 210 are transmitted over a communication channel 212, which suffers from noise. The channel 212 could represent any suitable communication channel, such as a wireless or fiber optic channel. In some embodiments, the channel 212 could be estimated as an additive white Gaussian noise (AWGN) channel.

The symbols 210, as transported over the channel 212 and affected by noise, are received as symbols $y_1^{Ns}$ 214. An LLR calculator 216 computes LLR values for the received symbols 214 to generate blocks 218 of LLR values. A polar decoder 220 decodes the received symbols 214 using the LLR blocks 218 and the polar code to generate output vectors 222. Ideally, the output vectors 222 match the input vectors 202. The output vectors 222 could be provided to any suitable destination(s), such as to a common destination or to multiple destinations via de-multiplexing. The polar decoder 220 can use feedback in the form of at least some of the bits (such as the least significant bits) from one or more prior output vectors 222 when decoding one or more current LLR blocks 218. The LLR calculator 216 includes any suitable structure for computing LLR values. The polar decoder 220 includes any suitable structure for generating decoded bits using LLR values and a polar code.

In the example shown in FIG. 2, the bits of all symbols 210 are transmitted over the same channel 212. However, this need not be the case. For example, as shown in FIG. 3, different bits of the symbols 210 could be transmitted over different communication channels 312a-312b. This can be done to help apply polar codes to higher-order modulation techniques. For instance, two consecutive bits within the stream of symbols 210 can be transmitted over different channels 312a-312b. The two channels 312a-312b can represent channels that are derived from two different statistical property sets. An example of this is represented in FIG. 4, where symbols containing the codewords 206 are transmitted over the channels 312a-312b in an interleaved manner (note that the symbol mapper 208 and LLR calculator 216 are omitted in FIG. 4 for simplicity).

In each of these examples, there are various "frozen" bits 224a contained in the input vectors 202 and corresponding "frozen" bits 224b contained in the output vectors 222. As noted above, each frozen bit 224a-224b denotes a bit whose value is fixed (either to a "1" or a "0") in both the input vector to a polar encoder and in the output vector from a polar decoder. The remaining bits in the input vectors 202 and the output vectors 222 represent information bits and are used to transport data between the polar encoder and the polar decoder.

Although FIGS. 2 through 4 illustrate examples of encoding and decoding schemes using polar codes, various changes may be made to FIGS. 2 through 4. For example, these figures merely illustrate various examples of the types of devices that can use polar codes designed as described below.

In general, a polar code can be characterized by a set of parameters such as (N, K, A, $u_{Ac}$), where N denotes the output block size in bits, K denotes the input information size in bits, A denotes the set of indices of the information bits (which is complemented by Ac that contains the indices of the frozen bits), and $u_{AC}$ denotes the values of the frozen bits. A standard generator matrix $G_N$ can be used for the encoding, such as:

$$G_N = B_N G_2^{\otimes n} \quad (1)$$

where $B_N$ is a bit reversal-based permutation matrix, and $G_2^{\otimes n}$ denotes the Kronecker product of $$G_2 = \begin{bmatrix} 1 & 0 \\ 1 & 1 \end{bmatrix}.$$

The polar code can have a length of $N=2^n$, with K denoting the dimension of the set of information bits |A|. With the generator matrix defined in Equation (1), the encoding can be described by:

$$x_1^N = u_1^N G_N \quad (2)$$

where $u_1^N$ is a row vector of length N of uncoded bits, and $x_1^N$ denotes a codeword (encoded bits) of length N. The code rate can be given by the ratio of K/N, while the set of frozen bits and their value are denoted by the vector $u_{Ac}$ of length N–K.

The design of a polar coding system can generally be viewed as a three-stage process. In the first two stages, the actual physical designs of an encoder and a decoder are created. In a third phase, the actual polar code to be used by the encoder and the decoder is created. In some embodiments, once the length of a polar code is specified, a low-complexity encoder and successive cancellation (SC) decoder or other decoder can have fixed algorithmic designs that do not vary for different rates of the same length polar code. Instead, a change in rate generates a change in the set of frozen bits, which is ordinarily chosen during the third phase. For a binary erasure channel (BEC), the set of frozen bits can be fairly easy to identify because a closed-form formula exists for calculating the polarization of the equivalent bit channels.

There are, however, various challenges encountered in the construction of polar codes, such as when higher-order modulation symbols are sent over an AWGN channel. When M-QAM symbols are used, this can be described as:

$$y_k = s_k + n_k, k=1,2,\ldots,N_s \quad (3)$$

where $s_k$ denotes the $k^{th}$ M-QAM symbol sent over the physical channel, $n_k$ denotes the complex AWGN $CN(0,\sigma^2)$ with zero mean and $\sigma^2$ variance, and $N_s$ denotes the number of symbols to transmit a code block.

Figure 5:
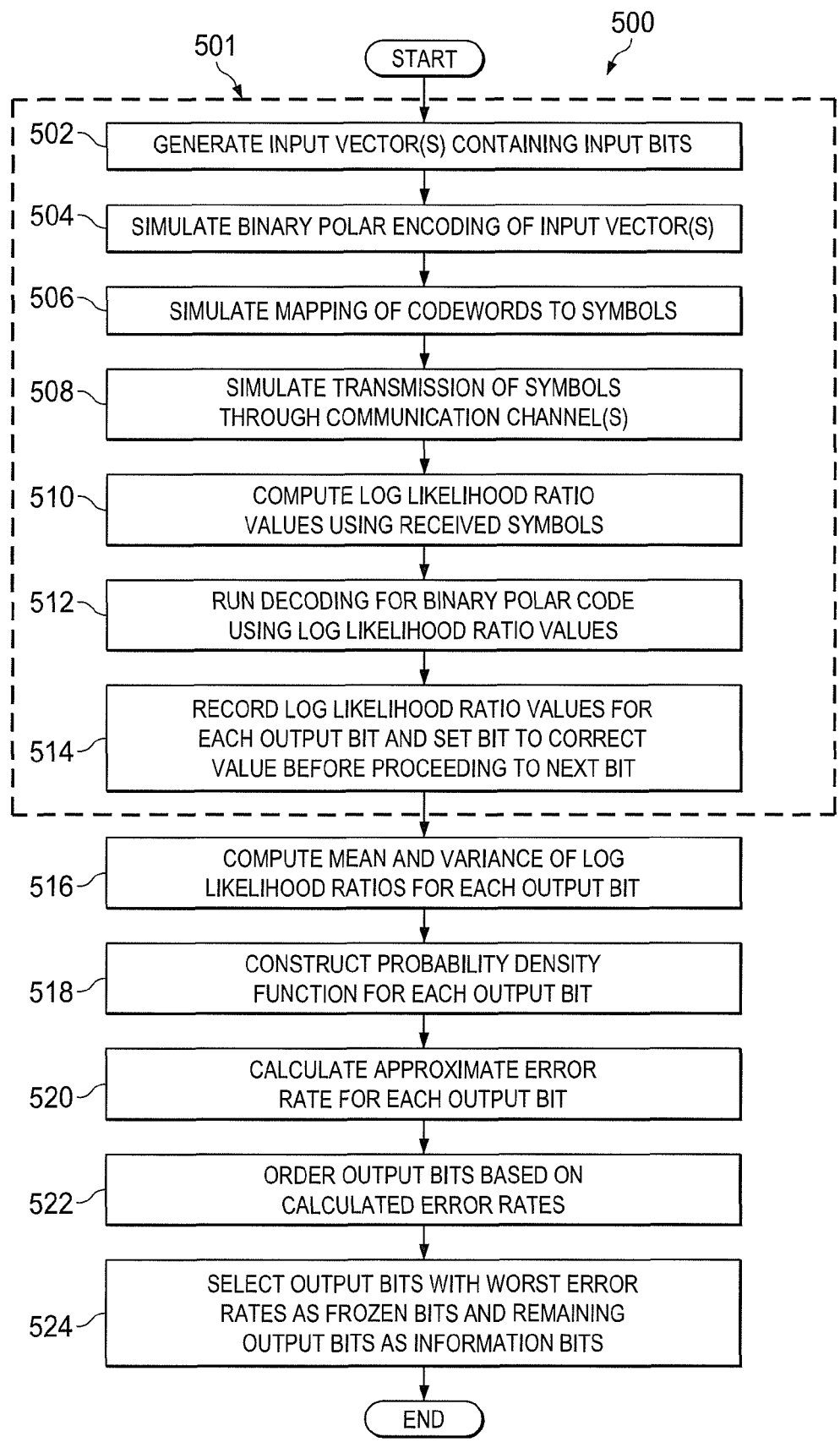
FIG. 5 illustrates an example method for supporting polar code designs in accordance with this disclosure.

FIG. 5 illustrates an example method 500 for supporting polar code designs in accordance with this disclosure. In particular, FIG. 5 illustrates an example method 500 for determining the indices of the frozen bits to be used by a polar encoder and a polar decoder.

As shown in FIG. 5, a simulation is performed to estimate LLR values for a set of bits to be encoded and decoded at step 501. In this example, the simulation is performed as follows. At least one input vector containing input bits is generated at step 502. This could include, for example, generating at least one input vector of random values having a length N. Binary polar encoding of the input vector(s) is simulated at step 504, and mapping of the resulting codewords to symbols is simulated at step 506. This could include, for example, simulating the performance of binary modulation or M-QAM. Transmission of the symbols over one or more communication channels is simulated at step 508. This could include, for example, simulating the transmission of the symbols over at least one AWGN channel. LLR values are calculated using the received symbols at step 510. This could include, for example, calculating blocks of LLR values as described below. Decoding for a binary polar code is performed using the LLR values at step 512. This could include, for example, using the blocks of LLR values and a successive decoding process to generate at least one output vector containing output bits. During this process, the LLR value of each bit is recorded, and each bit is assumed to be decoded correctly before the next bit is processed at step 514.

The results of the simulation can be used to design a polar code by selecting which bits in the polar code are frozen. In this example, the frozen bits are selected as follows. The mean and variance of the LLR values at each bit are calculated at step 516. The mean associated with the $i^{th}$ bit can be denoted and the variance associated with the $i^{th}$ bit can be denoted $\sigma_i^2$. A probability density function (PDF) for each output bit is constructed at step 518. This could include, for example, constructing a Gaussian PDF with the same mean and variance as calculated above for each output bit. An approximate bit error rate for each output bit is calculated using that output bit's PDF at step 520. This could include, for example, calculating the bit error rate (BER) for each output bit using that output bit's Gaussian PDF. The output bits are ranked in order of their error rates at step 522, and a selected number of bits with the worst error rates are used as the frozen bits at step 524. The remaining output bits are available for use as information bits.

In accordance with this approach, a measure based on the LLR is used for asymmetric continuous channels. This measure is expressed by first-order and second-order statistics of the random variable given by:

$$X_i = \begin{cases} +|LLR(W_N^{(i)})|, \text{ if correct decision} \\ -|LLR(W_N^{(i)})|, \text{ if wrong decision} \end{cases} \quad (4)$$

Here, $1 \le i \le N$, and $LLR(W_N^{(i)})$ denotes the log likelihood ratio of the equivalent bit channel i, which can be expressed as follows:

$$LLR(W_N^{(i)}) = \log \frac{W_N^{(i)}(Y_1^N, U_1^{i-1} | U_i = 0)}{W_N^{(i)}(Y_1^N, U_1^{i-1} | U_i = 1)} \quad (5)$$

Using, for example, Monte Carlo simulations, the first two moments of $X_i$ in Equation (4), the mean $m_i$, and the standard deviation $\sigma_i$ can be determined. An SC decoder with a random set of information bits can be used for which, at each equivalent bit channel, all previously decoded bits are assumed to be known. Note that the use of an SC decoder is optional and that other decoder realizations could be used, such as a list decoder or a belief-propagation decoder. Furthermore, the assumption that a channel is an AWGN channel is for illustration only, and other channel types could be used.

If the PDF of $X_i$ in Equation (4) is known, the probability of error of the equivalent bit channels can be directly evaluated. For example, the Gaussian approximation of a PDF can be calculated using the first two moments. This approximation is adequately accurate for highly-positive polarized equivalent bit channels.

With a Gaussian approximation, the probability of bit error at the $i^{th}$ equivalent bit channel (assuming all other previous bits are decoded properly) can be expressed as:

$$\beta_i = Q(m_i/\sigma_i) \quad (6)$$

where:

$$Q(x) \triangleq \frac{1}{\sqrt{2\pi}} \int_x^\infty \exp(-x^2/2) \quad (7)$$

After computing $\beta_i$ for all input bit locations, the indices of the information bits A are chosen to correspond to the equivalent bits with the smallest values of $\{\beta_i\}$. The frame error probability $P_F$ can then be calculated as:

$$P_F = 1 - \prod_{i \in A}(1 - \beta_i) \approx \sum_{i \in A} \beta_i \quad (8)$$

In general, $\{\beta_i\}$ are functions of the channel SNR γ, but their order tends to be insensitive to small changes in the SNR as the SNR increases. This can be important in practical communication systems since the operating region (the waterfall region of the SNR/BER curve) for a given code rate is typically within 1-2 dB and it may be necessary to have consistent ordering for that range.

Thus, for example, in a practical communication system that uses adaptive modulation, a single list can be stored that contains the universal ordering of the equivalent bit channels within a certain SNR range. A distinct list can be used for each modulation order. In each list, the indices of the bits at the top of the list can be assigned as frozen bits. The number of frozen bits (which corresponds to the code rate) can be determined by the SNR. This arrangement significantly simplifies the mechanism of designing the modulation and coding scheme (MCS) of a system. The above design procedure could be combined with any modulation scheme, where the modulation and the corresponding LLR calculation of the individual bits within each symbol are considered part of the underlying channel.

With the above parameterization, the code rate |A|/N for a frame error rate $\bar{P}_F$ could be computed analytically. For a given $\bar{P}_F$, the maximum code rate can correspond to a value calculated as follows:

$$\max|A| \text{ such that} \sum_{i \in A} \beta_i \le \bar{P}_F \quad (9)$$

where it is assumed that the indices in A are sorted in ascending order of $\beta_i$.

The method 500 described above provides a novel approach for designing polar codes by approximating the error rate of each equivalent bit channel. This approach is applied to identify the set of frozen bits and can be used independent of the modulation order. A byproduct of this design approach is that the prior estimation of the frame error rate of a polar code can be used as a function of the SNR. Among other things, this design approach enables efficient design for MLC schemes with optimal code rate assignments between different bit-levels. Moreover, because the design approach is generic and can be applied to any modulation order, it could be easily extended without much overhead to scenarios when grouping of bits is used.

Although FIG. 5 illustrates one example of a method 500 for supporting polar code designs, various changes may be made to FIG. 5. For example, while shown as a series of steps, various steps in FIG. 5 could overlap, occur in parallel, occur in a different order, or occur any number of times. Also, the exact simulation technique shown in step 501 of FIG. 5 is for illustration only, and other simulation techniques could be used.

Figure 6:
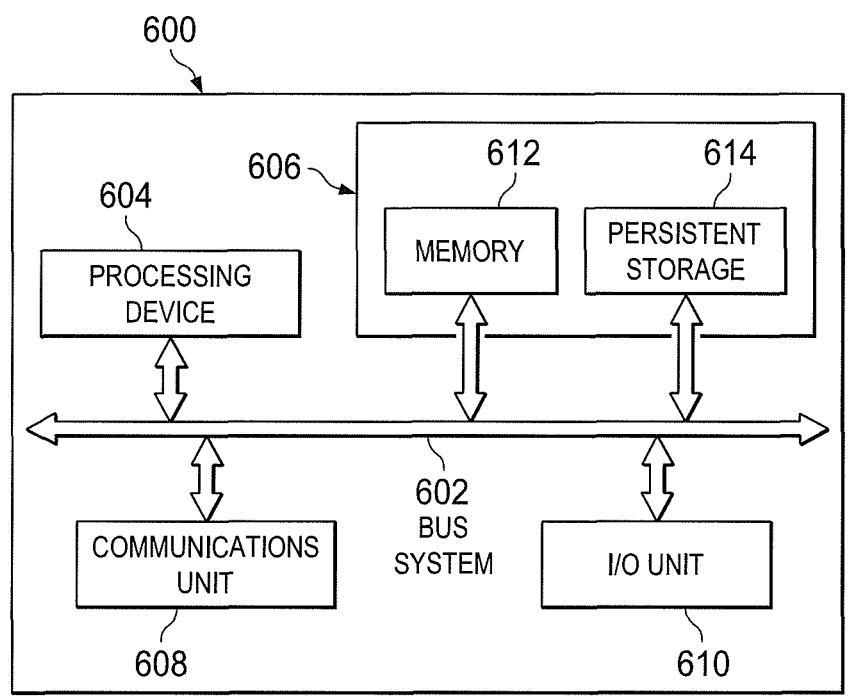
FIG. 6 illustrates an example device supporting polar code designs in accordance with this disclosure.

FIG. 6 illustrates an example device 600 supporting polar code designs in accordance with this disclosure. The device 600 could, for example, be used to implement the method 500 shown in FIG. 5 in order to design a polar code for use with any of the encoding and decoding schemes shown in FIGS. 2 through 4. Note, however, that the method 500 could be performed using other devices or for other encoding and decoding schemes.

As shown in FIG. 6, the device 600 includes a bus system 602. The bus system 602 is configured to support communication between at least one processing device 604, at least one storage device 606, at least one communications unit 608, and at least one input/output (I/O) unit 610.

The processing device 604 is configured to execute instructions that can be loaded into a memory 612. The device 600 can include any suitable number(s) and type(s) of processing devices 604 in any suitable arrangement. Example processing devices 604 can include microprocessors, microcontrollers, digital signal processors, field programmable gate arrays, application specific integrated circuits, and discrete circuitry. The processing device(s) 604 can be configured to execute processes and programs resident in the memory 612.

The memory 612 and a persistent storage 614 can represent any structure(s) capable of storing and facilitating retrieval of information (such as data, program code, or other suitable information on a temporary or permanent basis). The memory 612 can represent a random access memory or any other suitable volatile or non-volatile storage device(s). The persistent storage 614 can contain one or more components or devices supporting longer-term storage of data, such as a read-only memory, hard drive, Flash memory, or optical disc.

The communications unit 608 is configured to support communications with other systems or devices. For example, the communications unit 608 can include a network interface card or a wireless transceiver facilitating communications over a network. The communications unit 608 can be configured to support communications through any suitable physical or wireless communication link(s).

The I/O unit 610 is configured to allow for input and output of data. For example, the I/O unit 610 can be configured to provide a connection for user input through a keyboard, mouse, keypad, touchscreen, or other suitable input device. The I/O unit 610 can also be configured to send output to a display, printer, or other suitable output device.

Although FIG. 6 illustrates one example of a device 600 supporting polar code designs, various changes may be made to FIG. 6. For example, various components in FIG. 6 could be combined, further subdivided, or omitted and additional components could be added according to particular needs. In general, computing devices can come in a wide variety of configurations, from servers to desktop or laptop computers to portable devices such as mobile smartphones. FIG. 6 does not limit this disclosure to any particular computing device.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   simulating transmission of multiple symbols representing multiple bits over at least one communication channel, the multiple symbols associated with a polar code;
   identifying error rates of equivalent bit channels associated with the simulated transmission of the symbols; and
   selecting a specified number of the bits as frozen bits in the polar code using the identified error rates.

2. The method of claim 1, wherein simulating the transmission of the symbols comprises:

generating at least one input vector, each input vector comprising multiple uncoded bits;
simulating polar encoding of the at least one input vector using the polar code to generate at least one codeword;
simulating mapping of the at least one codeword to the multiple symbols; and
simulating transmission of the multiple symbols over the at least one communication channel.

3. The method of claim 2, wherein simulating the transmission of the symbols further comprises:
computing log likelihood ratio (LLR) values associated with the equivalent bit channels; and
simulating polar decoding of received symbols using the LLR values.

4. The method of claim 3, wherein identifying the error rates comprises:
calculating means and variances of the LLR values associated with the equivalent bit channels;
identifying probability density functions (PDFs) of the LLR values associated with the equivalent bit channels using the means and variances; and
identifying an error rate associated with each equivalent bit channel using that equivalent bit channel's PDF.

5. The method of claim 4, wherein selecting the specified number of the bits as the frozen bits in the polar code comprises:
identifying the specified number of the bits having worst error rates.

6. The method of claim 4, wherein:
simulating the transmission of the symbols comprises simulating the transmission of the symbols using Monte Carlo simulation;
the at least one communication channel is simulated as at least one additive white Gaussian noise (AWGN) channel;
each probability density function comprises a Gaussian PDF; and
simulating the polar decoding comprises simulating successive cancellation decoding of the received symbols.

7. The method of claim 2, wherein simulating the mapping of the at least one codeword to the multiple symbols comprises:
simulating performance of binary or multilevel quadrature amplitude modulation.

8. The method of claim 1, wherein the specified number is identified based on a desired code rate of the polar code.

9. An apparatus comprising:
at least one memory configured to store instructions; and
at least one processing device configured to execute the instructions in order to:
simulate transmission of multiple symbols representing multiple bits over at least one communication channel, the multiple symbols associated with a polar code;
identify error rates of equivalent bit channels associated with the simulated transmission of the symbols; and
select a specified number of the bits as frozen bits in the polar code using the identified error rates.

10. The apparatus of claim 9, wherein the at least one processing device is configured to simulate the transmission of the symbols by executing the instructions in order to:
generate at least one input vector, each input vector comprising multiple uncoded bits;
simulate polar encoding of the at least one input vector using the polar code to generate at least one codeword;
simulate mapping of the at least one codeword to the multiple symbols; and
simulate transmission of the multiple symbols over the at least one communication channel.

11. The apparatus of claim 10, wherein the at least one processing device is configured to simulate the transmission of the symbols further by executing the instructions in order to:
compute log likelihood ratio (LLR) values associated with the equivalent bit channels; and
simulate polar decoding of received symbols using the LLR values.

12. The apparatus of claim 11, wherein the at least one processing device is configured to identify the error rates by executing the instructions in order to:
calculate means and variances of the LLR values associated with the equivalent bit channels;
identify probability density functions (PDFs) of the LLR values associated with the equivalent bit channels using the means and variances; and
identify an error rate associated with each equivalent bit channel using that equivalent bit channel's PDF.

13. The apparatus of claim 12, wherein the at least one processing device is configured to select the specified number of the bits as the frozen bits in the polar code by executing the instructions in order to identify the specified number of the bits having worst error rates.

14. The apparatus of claim 12, wherein:
the at least one processing device is configured to simulate the transmission of the symbols using Monte Carlo simulation;
the at least one processing device is configured to simulate the at least one communication channel as at least one additive white Gaussian noise (AWGN) channel;
each probability density function comprises a Gaussian PDF; and
the at least one processing device is configured to simulate the polar decoding by executing the instructions in order to simulate successive cancellation decoding of the received symbols.

15. The apparatus of claim 10, wherein the at least one processing device is configured to simulate the mapping of the at least one codeword to the multiple symbols by executing the instructions in order to simulate performance of binary or multilevel quadrature amplitude modulation.

16. The apparatus of claim 9, wherein the at least one processing device is further configured to execute the instructions in order to select remaining bits of the multiple bits as information bits.

17. A non-transitory computer readable medium embodying a computer program, the computer program comprising computer readable program code for:
simulating transmission of multiple symbols representing multiple bits over at least one communication channel, the multiple symbols associated with a polar code;
identifying error rates of equivalent bit channels associated with the simulated transmission of the symbols; and
selecting a specified number of the bits as frozen bits in the polar code using the identified error rates.

18. The non-transitory computer readable medium of claim 17, wherein the computer readable program code for simulating the transmission of the symbols comprises computer readable program code for:
generating at least one input vector, each input vector comprising multiple uncoded bits;
simulating polar encoding of the at least one input vector using the polar code to generate at least one codeword;

simulating mapping of the at least one codeword to the multiple symbols;

simulating transmission of the symbols over the at least one communication channel;

computing log likelihood ratio (LLR) values associated with the equivalent bit channels; and simulating polar decoding of received symbols using the LLR values.

19. The non-transitory computer readable medium of claim 18, wherein the computer readable program code for identifying the error rates comprises computer readable program code for:

calculating means and variances of the LLR values associated with the equivalent bit channels;

identifying probability density functions (PDFs) of the LLR values associated with the equivalent bit channels using the means and variances; and identifying an error rate associated with each equivalent bit channel using that equivalent bit channel's PDF.

20. The non-transitory computer readable medium of claim 19, wherein the computer readable program code for selecting the specified number of the bits as the frozen bits in the polar code comprises computer readable program code for identifying the specified number of the bits having worst error rates.

* * * * *